United States Patent
Kakumu et al.

(10) Patent No.: US 12,283,310 B2
(45) Date of Patent: Apr. 22, 2025

(54) MEMORY DEVICE WITH SINGLE-TRANSISTOR DRAM CELLS WITH NO CAPACITORS, AND MEMORY CELLS STACKED IN THE VERTICAL DIRECTION USING GATE-ALL-AROUND (GAA) TECHNOLOGY

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 217 days.

(21) Appl. No.: 18/180,117

(22) Filed: Mar. 7, 2023

(65) Prior Publication Data
US 2023/0290404 A1    Sep. 14, 2023

(30) Foreign Application Priority Data
Mar. 8, 2022 (WO) .................. PCT/JP2022/009984

(51) Int. Cl.
*G11C 11/404* (2006.01)
*G11C 11/4097* (2006.01)
*H10B 12/00* (2023.01)

(52) U.S. Cl.
CPC .......... *G11C 11/4097* (2013.01); *H10B 12/20* (2023.02); *H10B 12/482* (2023.02); *H10B 12/488* (2023.02)

(58) Field of Classification Search
CPC .. G11C 11/4097; H10B 12/482; H10B 12/20; H10B 12/488
See application file for complete search history.

(56) References Cited

U.S. PATENT DOCUMENTS 9,653,170 B2 * 5/2017 Masuoka ........... G11C 16/0466
2003/0111681 A1 6/2003 Kawanaka
(Continued)

FOREIGN PATENT DOCUMENTS

JP    2003-188279 A    7/2003
JP    2008-147514 A    6/2008
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (Mar. 1991).

(Continued)

*Primary Examiner* — Mushfique Siddique
(74) *Attorney, Agent, or Firm* — Crowell & Moring LLP

(57) ABSTRACT

A first insulating layer 21 is disposed on a substrate 20. N+ layers 2 are separated from the insulating layer and in directions horizontal and vertical to the substrate. P layers 1 contact the n+ layers 2 and extend in the horizontal direction. N+ layers 3 contact the p layers 1. Gate insulating layers 4 cover the p layers 1 and part of the n+ layers 2 and 3. Second gate conductor layers 6 are electrically separated from a first gate conductor layer 5 contacting the gate insulating layers 4. A conductor layer 12 contacts the n+ layers 2. A conductor layer 13 contacts the n+ layers 3. A second insulating layer 22 contacts the first gate conductor layer 5, the n+ layers 2, and the conductor layer 12. A third insulating layer 23 contacts the second gate conductor layers 6, the n+ layers 3, and the conductor layer 13.

10 Claims, 11 Drawing Sheets

(56) References Cited

U.S. PATENT DOCUMENTS

| | | | |
|---|---|---|---|
| 2006/0157738 A1 | 7/2006 | Kawanaka | |
| 2006/0187706 A1* | 8/2006 | Tang | H01L 29/7841 365/177 |
| 2008/0137394 A1 | 6/2008 | Shimano et al. | |
| 2008/0205133 A1 | 8/2008 | Gonzalez et al. | |
| 2011/0062417 A1 | 3/2011 | Iwayama et al. | |
| 2011/0169067 A1* | 7/2011 | Ernst | H01L 21/8221 257/E21.422 |
| 2012/0092925 A1* | 4/2012 | Chen | H01L 29/7841 365/182 |
| 2019/0172828 A1 | 6/2019 | Smith et al. | |
| 2019/0206869 A1* | 7/2019 | Kim | H01L 29/74 |
| 2019/0267074 A1* | 8/2019 | Fishburn | G11C 11/4097 |
| 2020/0135863 A1 | 4/2020 | Han et al. | |
| 2020/0279601 A1* | 9/2020 | Kim | G11C 11/4097 |
| 2021/0028169 A1 | 1/2021 | Smith et al. | |
| 2022/0028857 A1* | 1/2022 | Baek | H10B 12/10 |
| 2022/0223196 A1* | 7/2022 | He | G11C 11/4094 |
| 2022/0335982 A1* | 10/2022 | He | H10D 62/118 |

FOREIGN PATENT DOCUMENTS

| | | | | |
|---|---|---|---|---|
| JP | 2010-519770 A | | 6/2010 | |
| JP | 2011-066151 A | | 3/2011 | |
| JP | 2011-527515 A | | 10/2011 | |
| JP | 2021-508414 A | | 3/2021 | |
| WO | WO-2023170782 A1 * | 9/2023 | | G11C 11/4097 |
| WO | WO-2023188006 A1 * | 10/2023 | | G11C 11/404 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase change Memory," Proceeding of IEEE, vol. 98, No. 12, December, pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007), pp. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp. 1-9 (Jun. 2015).

M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (May 2010).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, No. 4, pp. 1471-1479 (Apr. 2020).

"Future Scaling and Integration technology", International Electron Device Meeting Short Course (2021).

IPER in Application No. PCT/JP2022/009984, dated Mar. 1, 2023.

International Preliminary Report on Patentability in International Application No. PCT/JP2022/009984, dated Sep. 12, 2024 (5 pages).

* cited by examiner

MEMORY DEVICE WITH SINGLE-TRANSISTOR DRAM CELLS WITH NO CAPACITORS, AND MEMORY CELLS STACKED IN THE VERTICAL DIRECTION USING GATE-ALL-AROUND (GAA) TECHNOLOGY

This application claims priority to PCT/JP2022/009984, filed on Mar. 8, 2022, the entire content of which is incorporated herein by reference.

BACKGROUND OF THE INVENTION

Field of the Invention

The present invention relates to a semiconductor memory device.

Description of the Related Art

High integration, high performance, low electric power consumption, and high functionality of a memory element have been requested in recent development of large scale integration (LSI) technologies.

In a normal planar MOS transistor, a channel extends in a horizontal direction along the upper surface of a semiconductor substrate. However, a channel of an SGT extends in a direction orthogonal to the upper surface of a semiconductor substrate (refer to Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991), for example). Thus, densification of a semiconductor device is possible with the SGT unlike with the planar MOS transistor. The SGT can be used as a selection transistor to achieve high integration of a dynamic random access memory (DRAM; refer to H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011), for example) connected to a capacitor, a phase change memory (PCM; refer to H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010), for example) connected to a resistance change element, a resistive random access memory (RRAM; refer to T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V", IEDM (2007), for example), a magneto-resistive random access memory (MRAM; refer to W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015), for example) that changes resistance by changing the orientation of magnetic spin by current, and the like. In addition, there are, for example, a DRAM memory cell (refer to M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010), and Takashi Ohsawa and Takeshi Hamamoto, "Floating Body Cell—a Novel Body Capacitorless DRAM Cell", Pan Stanford Publishing (2011), for example) including no capacitor and constituted by one MOS transistor, a DRAM memory cell (refer to Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020), for example) including a groove portion in which carriers are accumulated and two gate electrodes. However, a DRAM including no capacitor has such a problem that a sufficient voltage margin cannot be obtained due to high dependency on coupling of a gate electrode to a word line of a floating body. Furthermore, when a substrate is completely depleted, adverse influence thereof is large. The present application relates to a memory device including semiconductor elements, the memory device including no resistance change element nor capacitor but only including a MOS transistor.

The present application provides a memory device of a single-transistor DRAM including no capacitor, the memory device capable of solving problems such as noise due to capacitive coupling between a word line and a body, and false reading and false rewriting of storage data due to memory instability. The present application also provides a semiconductor memory device that achieves a highly-dense and high-speed MOS circuit by introducing a structure in which memory cells are stacked in the vertical direction by using a gate-all-around (GAA) technology (refer to "Future Scaling and Integration technology", International Electron Device Meeting Short Course (2021), for example).

SUMMARY OF THE INVENTION

To solve the above-described problem, a semiconductor memory device according to the present invention includes:
a first insulating layer disposed on a substrate;
a plurality of first impurity layers separated from the first insulating layer, extending in a direction horizontal to the substrate, and disposed separately from each other in a direction vertical to the substrate;
a plurality of semiconductor layers contacting the plurality of respective first impurity layers on an extension side of the semiconductor layers and extending in the direction horizontal to the substrate;
a plurality of second impurity layers connected to the plurality of respective semiconductor layers on an extension side of the second impurity layers and extending in the horizontal direction;
a plurality of gate insulating layers covering the plurality of respective semiconductor layers, part of the plurality of respective first impurity layers, and part of the plurality of respective second impurity layer;
a first gate conductor layer disposed in contact with the plurality of gate insulating layers and in proximity to the plurality of first impurity layers;
a plurality of second gate conductor layers not contacting the first gate conductor layer and disposed in contact with the plurality of respective gate insulating layers and in proximity to the plurality of respective second impurity layers;
a first conductor layer connected to the plurality of first impurity layers on an extension side opposite a side on which the plurality of semiconductor layers are disposed with respect to the first conductor layer;
a second conductor layer connected to the plurality of second impurity layers on an extension side opposite a side on which the plurality of semiconductor layers are disposed with respect to the second conductor layer;

a second insulating layer contacting the first insulating layer, the first gate conductor layer, and the first conductor layer; and a third insulating layer contacting the first insulating layer, the plurality of second gate conductor layers, and the second conductor layer, in which memory write operation is performed by controlling voltage applied to each of the first conductor layer, the second conductor layer, the first gate conductor layer, and the plurality of second gate conductor layers to perform operation of generating electrons and holes in the plurality of semiconductor layers through an impact ionization phenomenon with current flowing between the plurality of first impurity layers and the plurality of second impurity layers or through gate induced drain leakage current and perform operation of retaining, in the plurality of semiconductor layers, some or all of the generated electrons or holes that are majority carriers in the plurality of semiconductor layers, and memory erase operation is performed by controlling voltage applied to each of the first conductor layer, the second conductor layer, the first gate conductor layer, and the plurality of second gate conductor layers to remove the retained electrons or holes that are majority carriers in the semiconductor layers from at least either of the plurality of first impurity layers and the plurality of second impurity layers (first invention).

In the above-described first invention, the first conductor layer connected to the plurality of first impurity layers is connected to a source line, the second conductor layer connected to the plurality of second impurity layers is connected to a bit line, the first gate conductor layer is connected to a plate line, the plurality of second gate conductor layers are each connected to a word line, and predetermined voltage is provided to each of the source line, the bit line, the plate line, and the word line to perform memory writing and erasure (second invention).

In the above-described first invention, when a memory cell includes a semiconductor device constituted by the first impurity layer, the second impurity layer, one of the semiconductor layers, one of the gate insulating layers, the first gate conductor layer, and one of the second gate conductor layers, cross-sectional area of the semiconductor layer is larger than total area of maximum depleted layer widths each extending from immediately below the first gate conductor layer or the second gate conductor layer in a cross-sectional view of the semiconductor layer of the memory cell in the direction vertical to the substrate (third invention).

In the above-described third invention, an interval between the memory cells adjacent to each other in the direction vertical to the substrate is larger than an interval between the memory cells adjacent to each other in the direction horizontal to the substrate (fourth invention).

In the above-described first invention, the second gate conductor layers are each shared by the memory cells adjacent to each other in the direction horizontal to the substrate (fifth invention).

In the above-described first invention, the first gate conductor layer is shared by a plurality of cells adjacent to each other in the direction horizontal or vertical to the substrate (sixth invention).

In the above-described first invention, area of a surface at which the first conductor layer contacts each of the plurality of first impurity layers is equal to or larger than cross-sectional area of a corresponding one of the plurality of semiconductor layers connected to the first impurity layers (seventh invention).

In the above-described first invention, area of a surface at which the second conductor layer contacts each of the plurality of second impurity layers is equal to or larger than cross-sectional area of a corresponding one of the plurality of semiconductor layers connected to the plurality of second impurity layers (eighth invention).

In the above-described first invention, both or either of each of the plurality of first impurity layers and each of the plurality of second impurity layers is shared by cells adjacent to each other in the direction horizontal to the substrate (ninth invention).

In the above-described second invention, at a terminal end of a cell array, a first metal electrode contacts the first conductor layer and is connected to the source line, a second metal electrode contacts the first gate conductor layer and is connected to the plate line, a third metal electrode contacts the second conductor layer and is connected to the bit line, and a plurality of fourth metal electrodes contact the plurality of respective second gate conductor layers and are connected to respective word lines (tenth invention).

In the above-described first invention, all or some metal wires that function as a plate line, a source line, a word line, and a bit line among metal wires connecting cell arrays are formed as metal wires of a same layer (eleventh invention).

DETAILED DESCRIPTION OF THE PREFERRED EMBODIMENT

A structure of a memory device including semiconductor elements, a drive method, accumulation carrier behavior, cell disposition of the semiconductor device, and a wiring structure according to the present invention will be described below with reference to the accompanying drawings.

First Embodiment

The structure and operation mechanism of a memory cell including semiconductor elements according to a first embodiment of the present invention will be described below with reference to FIGS. 1A to 4B. The cell structure and memory cell disposition of a memory including semiconductor elements according to the present embodiment will be described with reference to FIGS. 1A, 1B, 1C, and 1D. FIGS. 2A, 2B, and 2C illustrate an applicative form of the memory in FIGS. 1A to 1D. The writing mechanism and carrier behavior of the memory including semiconductor elements will be described with reference to FIGS. 3A, 3B, and 3C, and the data erasing mechanism thereof will be described with reference to FIGS. 4A and 4B. In addition, an example of memory cell arrangement of a semiconductor device according to the present embodiment will be described with reference to FIGS. 5A, 5B, 5C, and 5D, and a wiring structure at a last edge in the memory cell according to the present embodiment will be described with reference to FIGS. 6A and 6B.

Figure 1A:
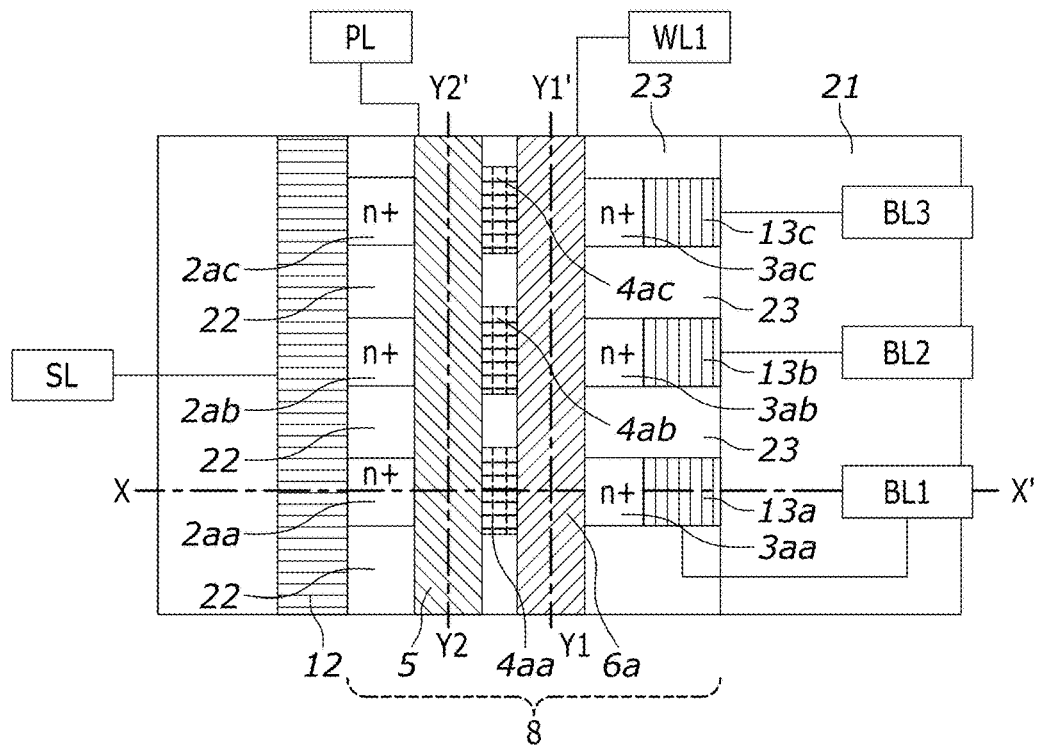
FIGS. 1A, 1B, 1C, and 1D are diagrams illustrating sectional structures of a memory device including semiconductor elements according to a first embodiment.
Figure 1B:
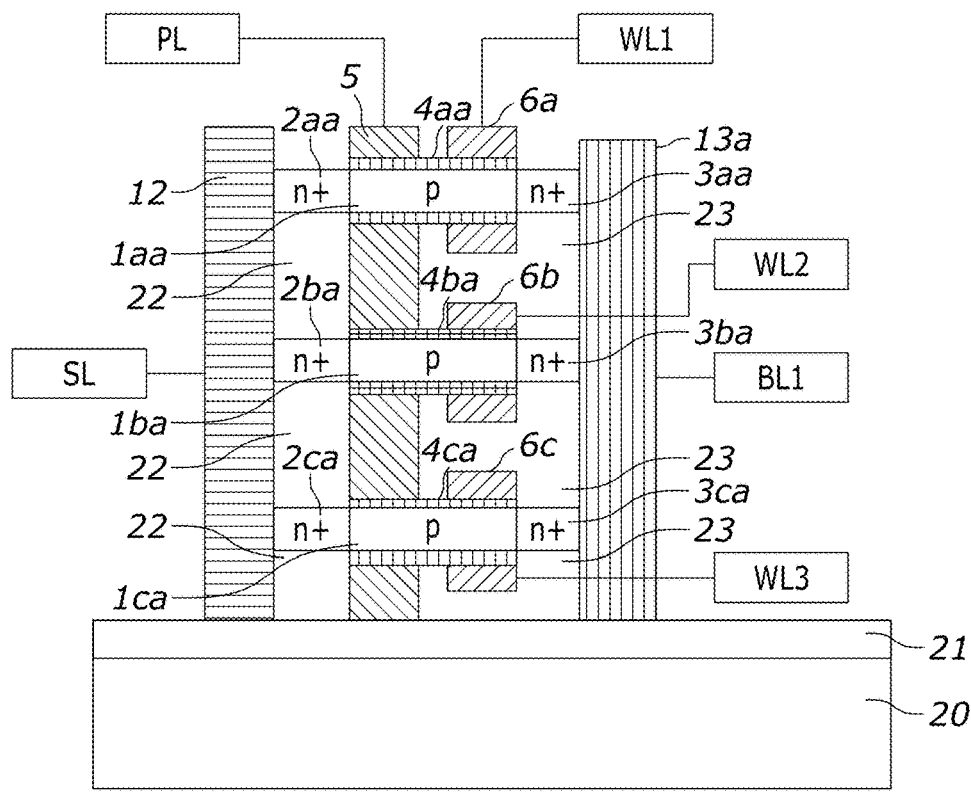
Figure 1C:
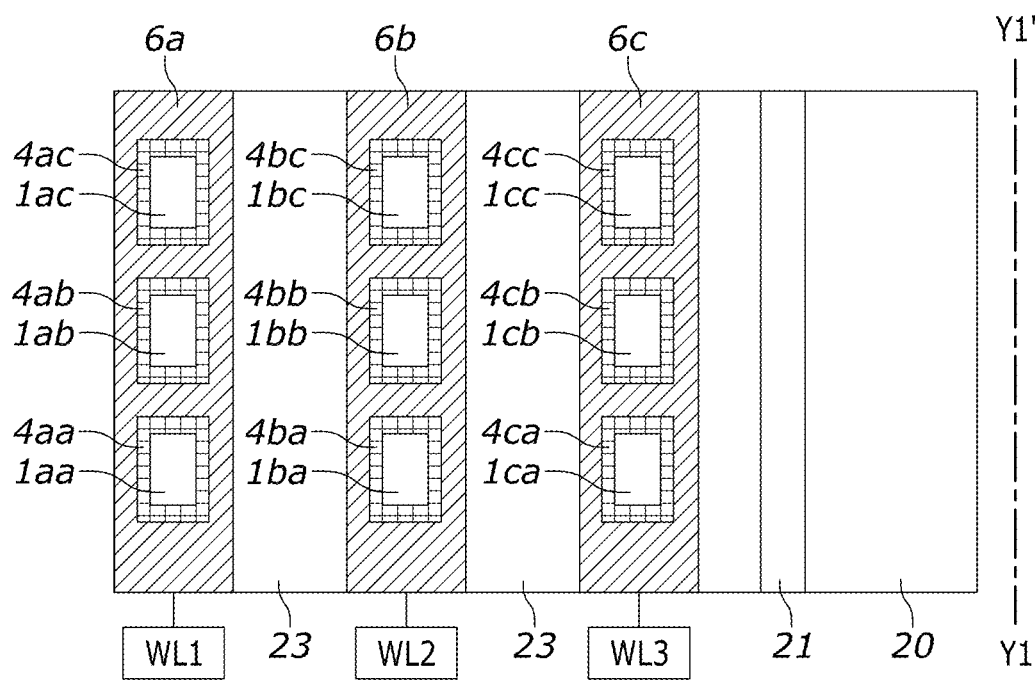
Figure 1D:
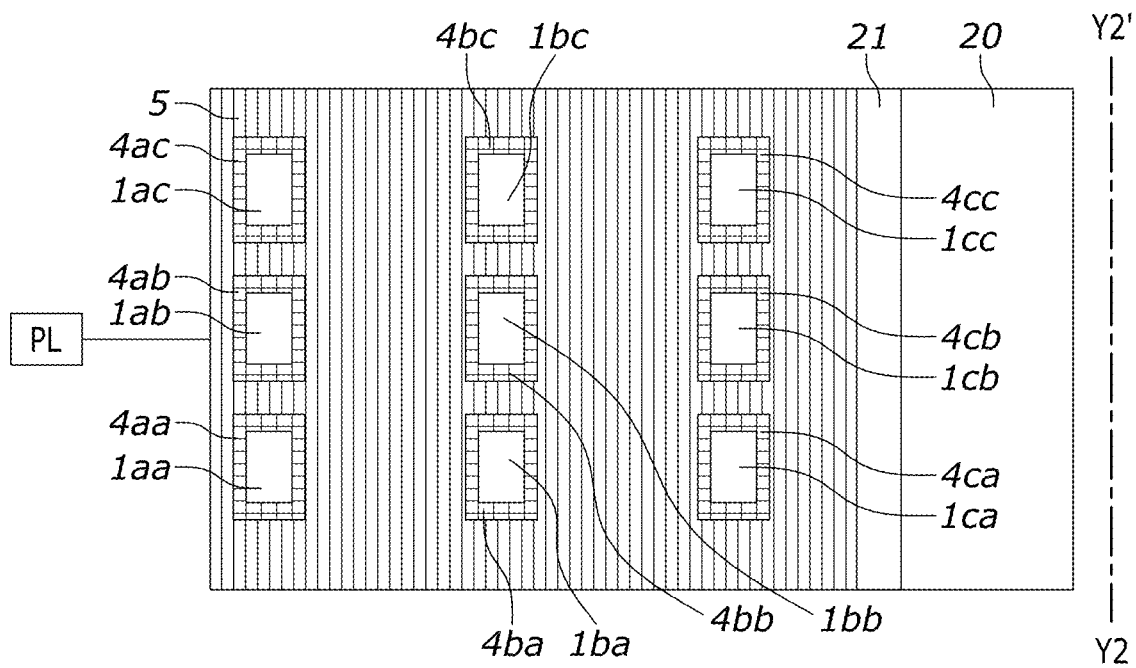
Figure 2A:
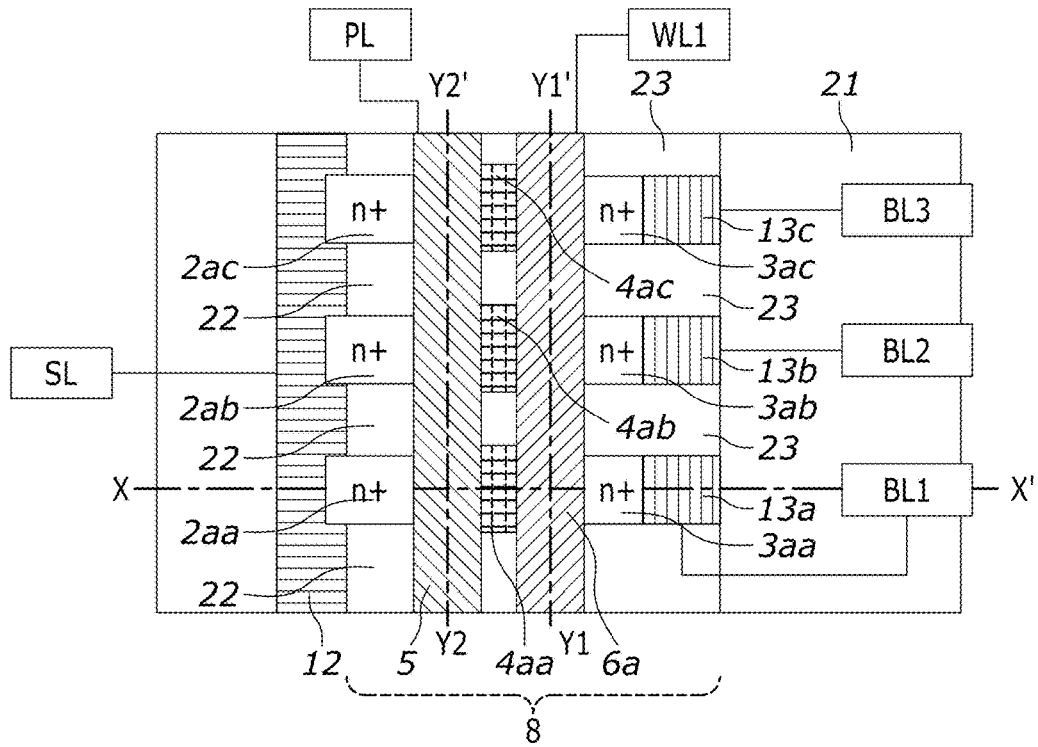
FIGS. 2A, 2B, and 2C are diagrams illustrating additional examples of sectional structures of the memory device including semiconductor elements according to the first embodiment.
Figure 2B:
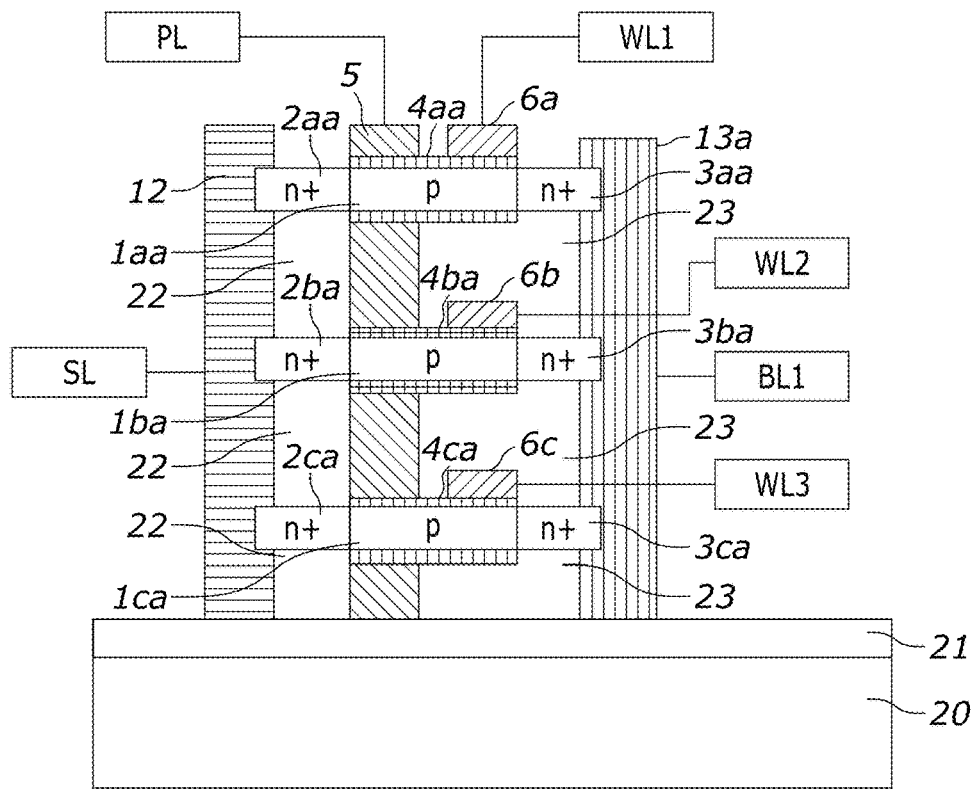
Figure 2C:
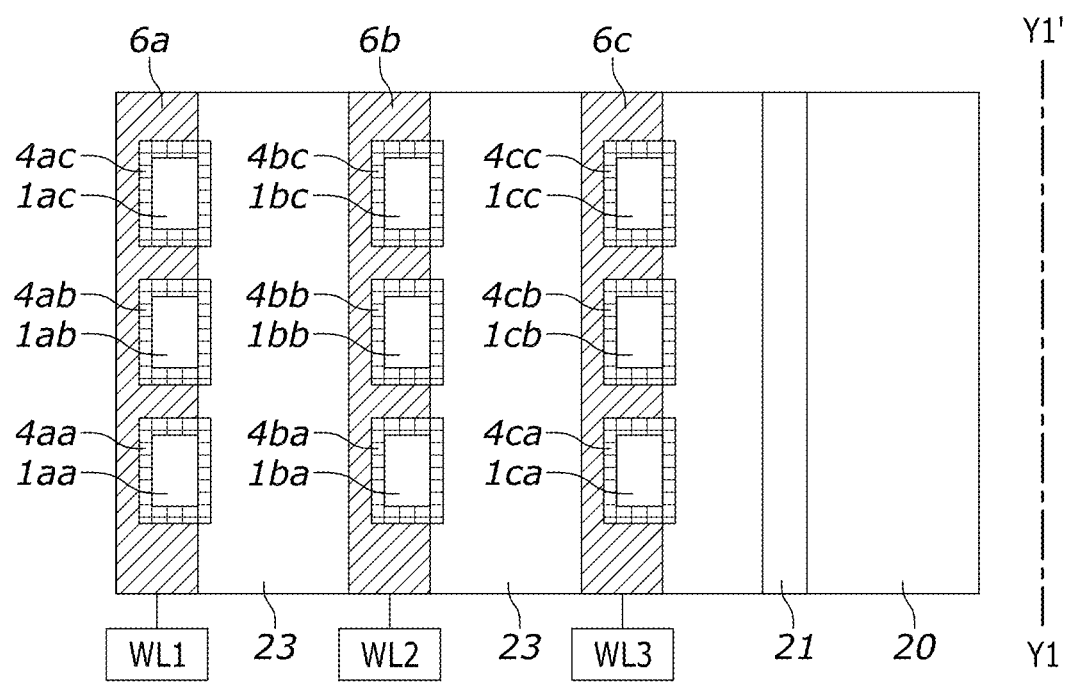

FIGS. 1A to 1D illustrate the structure of the memory including semiconductor elements according to the first embodiment of the present invention. FIG. 1A is a plan view, FIG. 1B is a cross-sectional view along line X-X', FIG. 1C is a cross-sectional view along line Y1-Y1', and FIG. 1D is a cross-sectional view along line Y2-Y2'. The structure of a topmost memory cell as a minimum unit along line X-X' will be described first and then the entire memory configuration in which a plurality of such memory cells are disposed will be described.

An insulating layer 21 (example of "first insulating layer" in the claims) is disposed on a substrate 20 (example of "substrate" in the claims). An n+ layer 2aa (example of "first impurity layer" in the claims) (hereinafter, a semiconductor region containing high concentration of donor impurities is referred to as an "n+ layer") is disposed in parallel to the substrate 20. A p-type semiconductor layer 1aa (example of "semiconductor layer" in the claims) (hereinafter, a p-type semiconductor layer is referred to as a "p layer") is disposed in connection with the n+ layer 2aa. An n+ layer 3aa (example of "second impurity layer" in the claims) is disposed in connection with the p layer 1aa and on a side opposite the n+ layer 2aa. A gate insulating layer 4aa (example of "gate insulating layer" in the claims) is disposed on part of the surface of the p layer 1aa. A first gate conductor layer 5 (example of "first gate conductor layer" in the claims) is disposed around part of the gate insulating layer 4aa and in proximity to the n+ layer 2aa. A gate conductor layer 6a (example of "second gate conductor layer" in the claims) does not contact the gate conductor layer 5 and is disposed in contact with the gate insulating layer 4aa and in proximity to the n+ layer 3aa. Accordingly, one dynamic flash memory cell 8 (illustrated with a dotted line in FIG. 1A) (example of "memory cell" in the claims) is constituted by the p layer 1aa, the n+ layer 2aa, the n+ layer 3aa, the gate insulating layer 4aa, the gate conductor layer 5, and the gate conductor layer 6a.

In the memory device, above-described dynamic flash memory cells 8 are arrayed separately from each other in a vertical direction (hereinafter, referred to as a "column direction" or a "column") on the substrate 20 and the insulating layer 21. The dynamic flash memory cells 8 are also arrayed in a horizontal direction (hereinafter referred to as a "row direction" or a "row"). FIGS. 1A to 1D illustrate an example in which the memory cells 8 are disposed on three rows and three columns. The horizontal direction in FIGS. 1A to 1D is the upward direction in FIG. 1A.

FIG. 1B illustrates a cross-sectional view of three cells disposed on the first column. The memory cell on the first row and the first column is constituted by the p layer 1aa, the n+ layer 2aa, the n+ layer 3aa, the gate insulating layer 4aa, the gate conductor layer 5, and the gate conductor layer 6a as described above. The memory cell on the first row and the second column is constituted by a p layer 1ba, an n+ layer 2ba, an n+ layer 3ba, a gate insulating layer 4ba, the gate conductor layer 5, and a gate conductor layer 6b. The memory cell on the first row and the third column is constituted by a p layer 1ca, an n+ layer 2ca, an n+ layer 3ca, a gate insulating layer 4ca, the gate conductor layer 5, and a gate conductor layer 6c. The n+ layers 2aa, 2ba, and 2ca are connected to a first conductor layer 12 (example of "first conductor layer" in the claims). The n+ layers 3aa, 3ba, and 3ca are connected to a second conductor layer 13a (example of "second conductor layer" in the claims). Accordingly, memory cell arrays on the first row are configured. Such memory cell arrays are arranged in the horizontal direction (upward direction in FIG. 1A) with respect to the substrate 20 to configure a memory device including a total of nine memory cells on three columns and three rows. In the memory device, an insulating layer 22 (example of "second insulating layer" in the claims) contacts the gate conductor layer 5, the conductor layer 12, and the insulating layer 21, and an insulating layer 23 (example of "third insulating layer" in the claims) contacts the gate conductor layer 5, conductor layers 13a, 13b, and 13c, and the insulating layer 21.

FIG. 1C illustrates sectional structures of nine cell arrays along line Y1-Y1' in FIG. 1A at p layers. In the drawing, each cell is denoted by reference signs in the form of p layer 1xy and gate insulating layer 4xy, for example. The letters x and y following the number in such a reference sign correspond to a row and a column, respectively. The letter "a" indicates the first row or the first column, the letter b indicates the second row or the second column, and the letter c indicates the third row or the third column (hereinafter, these rows and columns are collectively referred to only with a number in some cases; for example, the p layers 1aa to 1cc are collectively referred to as p layers 1 in some cases). Each gate conductor layer 6x is shared by cells on the corresponding row, and for example, the gate conductor layer 6a is shared by cells including the p layers 1aa, 1ab, and 1ac. Similarly, the gate conductor layer 6b is shared by cells including the p layers 1ba, 1bb, and 1bc, and the gate conductor layer 6c is shared by cells including the p layers 1ca, 1cb, and 1cc.

FIG. 1D illustrates sectional structures of nine cell arrays along line Y2-Y2' in FIG. 1A at the gate conductor layer 5. The gate conductor layer 5 is shared by the gate insulating layers 4aa to 4cc of the nine cells.

The conductor layer 12 is connected to a source line SL (example of "source line" in the claims), and the gate conductor layer 5 is connected to a plate line PL (example of "plate line" in the claims). The conductor layer 13a is connected to a bit line BL1 (example of "bit line" in the claims), the conductor layer 13b is connected to a bit line BL2, and the conductor layer 13c is connected to a bit line BL3. The gate conductor layer 6a is connected to a word line WL1 (example of "word line" in the claims), the gate conductor layer 6b is connected to a word line WL2, and the gate conductor layer 6c is connected to a word line WL3. Memory operation is performed by manipulating the potential of each of the source line, the bit lines, the plate line, and the word lines. Such a memory device is referred to as a dynamic flash memory below.

The p layers 1aa to 1cc are p-type semiconductor in FIGS. 1A to 1D but may have a profile of impurity concentration. In addition, the n+ layers 2aa to 2cc and the n+ layers 3aa to 3cc may have a profile of impurity concentration.

When the n+ layers 2aa to 2cc and the n+ layers 3aa to 3cc are replaced by p+ layers (hereinafter, a semiconductor region containing high concentration of acceptor impurities is referred to as a "p+ layer") in which majority carriers are holes, dynamic-flash-memory operation can be performed with electrons as writing carriers when the p layers 1aa to 1cc are replaced by n-type semiconductor.

The substrate 20 in FIGS. 1A to 1D may be made of an optional material such as an insulator, a semiconductor, or a conductor, on which the insulating layer 21 can be formed and that can support memory cells.

The gate conductor layer 5 and the gate conductor layers 6a to 6c may be formed of a metal or metal nitride such as W, Pd, Ru, Al, TiN, TaN, or WN, an alloy thereof (including silicide), or a laminated structure such as TiN/W/TaN or of a semiconductor doped at high concentration as long as the layers can change the potential of part of the memory cells through the gate insulating layers 4aa to 4cc.

The conductor layer 12 and the conductor layers 13a to 13c may be formed of any material as long as the layers can be electrically connected to the n+ layers 2aa to 2cc and the n+ layers 3aa to 3cc, respectively.

Any insulating film used in a normal MOS process, such as a SiO2 film, a SiON film, a HfSiON film, or a SiO2/SiN multilayer film is usable as the gate insulating layers 4aa to 4cc.

The vertical section of each memory cell has a rectangular shape in the description with reference to FIGS. 1A to 1D but may have a trapezoid shape, a polygonal shape, or a cylindrical shape.

The gate conductor layer 5 in each memory cell 8 is a single layer in FIGS. 1A to 1D but may be divided in the direction horizontal or vertical to the substrate 20.

The insulating layer 22 and the insulating layer 23 are divided from each other in FIGS. 1A to 1D but may be formed as a single layer of the same material or as a multi-layer of combination of a plurality of materials.

FIGS. 2A to 2C illustrate a modification of the memory structure illustrated in FIGS. 1A to 1D according to the first embodiment of the present invention. FIG. 2A is a plan view, FIG. 2B is a cross-sectional view along line X-X' in FIG. 2A, and FIG. 2C is a cross-sectional view along line Y1-Y1' in FIG. 2A.

In FIGS. 1A to 1D, it is illustrated as if the n+ layers 2aa to 2cc each contact the conductor layer 12 at a single surface, but as illustrated in FIGS. 2A and 2B, the contact surface of each of the n+ layers 2aa to 2cc and the conductor layer 12 may be larger than the cross-sectional area of each of the n+ layers 2aa to 2cc. Similarly, in FIGS. 1A to 1D, it is illustrated as if the n+ layers 3aa to 3cc each contact the corresponding one of the conductor layers 13a to 13c at a single surface, but as illustrated in FIGS. 2A and 2B, the contact area of each of the n+ layers 3aa to 3cc and the corresponding one of the conductor layers 13a to 13c may be larger than the cross-sectional area of each of the n+ layers 3aa to 3cc. Accordingly, it is possible to achieve wiring with small contact resistance between each of the n+ layers 2 and 3 and the corresponding one of the conductor layer 12 and the conductor layers 13.

Even when not the entire circumference of each of the gate insulating layers 4aa to 4ac is covered by the gate conductor layer 6a unlike FIGS. 1A to 1D, dynamic-flash-memory operation can be performed as long as the gate conductor layer 6a contacts part of the gate insulating layers 4aa to 4ac as illustrated in FIGS. 2B and 2C.

Figure 3A:
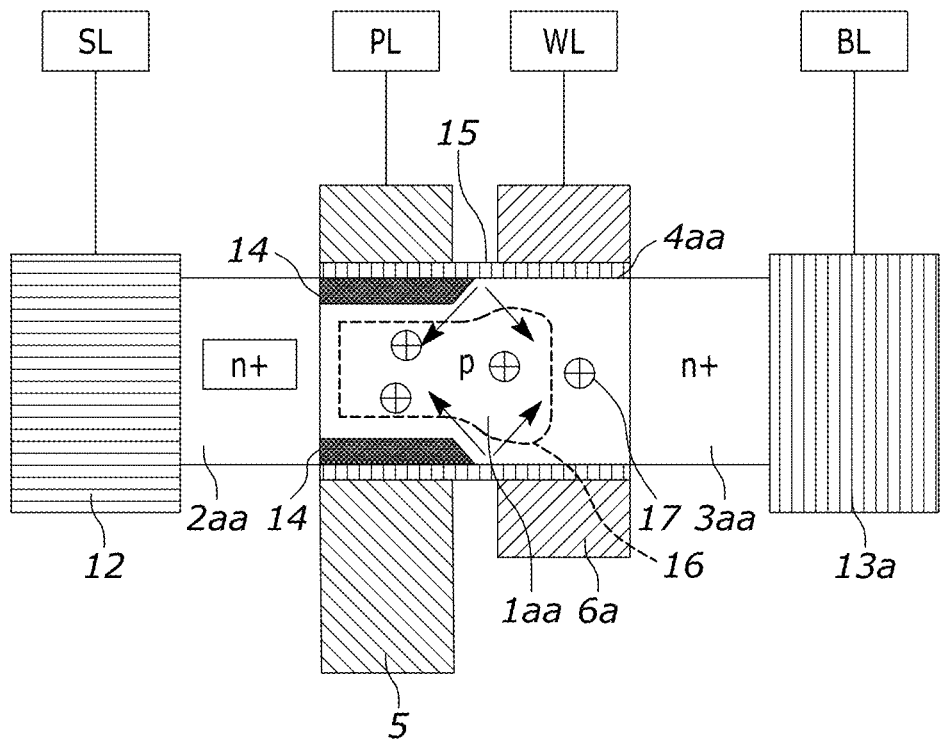
FIGS. 3A, 3B, and 3C are diagrams for description of write operation, carrier accumulation right after the operation, and cell current in the memory device including semiconductor elements according to the first embodiment.

Carrier behavior, accumulation, and cell current at write operation in the dynamic flash memory according to the first embodiment of the present invention will be described below with reference to FIGS. 3A to 3C. The operation principle will be described with a focus on the memory cell on the first row and the first column in FIG. 1A. The description will be first made on a case in which majority carriers in the n+ layer 2aa and the n+ layer 3aa are electrons, for example, the gate conductor layer 6a connected to the corresponding WL and the gate conductor layer 5 connected to the PL are formed of n+ poly (hereinafter, poly Si containing high concentration of donor impurities is referred to as "n+ poly"), and the p layer 1aa is formed of a p-type semiconductor as illustrated in FIG. 3A. For example, 0 V is input to the n+ layer 2aa through the conductor layer 12 connected to the source line SL. For example, 3 V is input to the n+ layer 3aa through the conductor layer 13a connected to the corresponding bit line BL. For example, 3 V is input to the gate conductor layer 5 connected to the plate line PL. For example, 1.5 V is input to the gate conductor layer 6a connected to the word line WL.

In this voltage applied state, electrons flow from the n+ layer 2aa toward the n+ layer 3aa. An inversion layer 14 is formed immediately below the gate insulating layer 4aa, electric field becomes maximum at a pinch-off point 15, and an impact ionization phenomenon occurs in this region. Through the impact ionization phenomenon, electrons accelerated from the n+ layer 2aa connected to the source line SL toward the n+ layer 3aa connected to the bit line BL collide with Si lattices, and electron-hole pairs are generated by kinetic energy of the collision. The generated electrons partially flow to the gate conductor layer 6a but mostly flow to the n+ layer 3aa connected to the bit line BL.

Figure 3B:
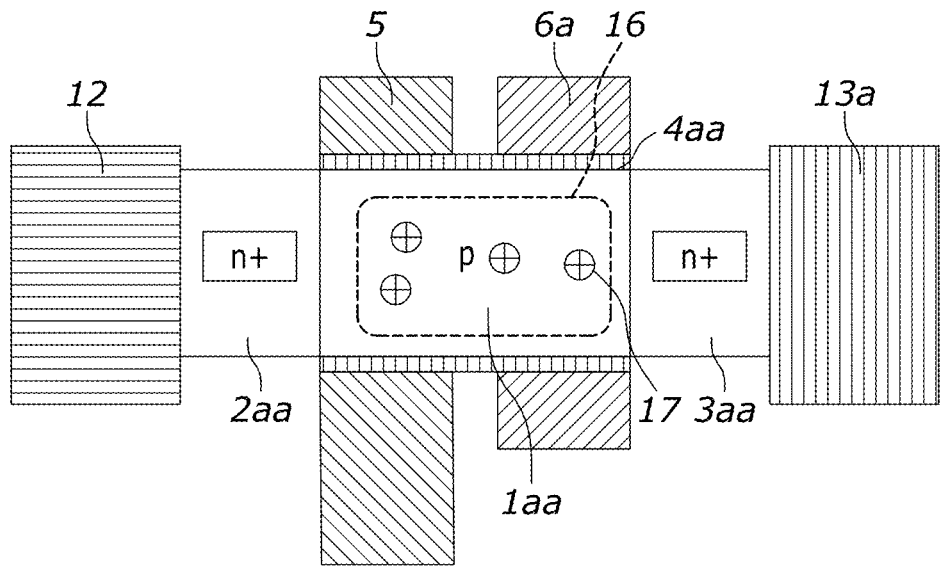
Figure 3C:
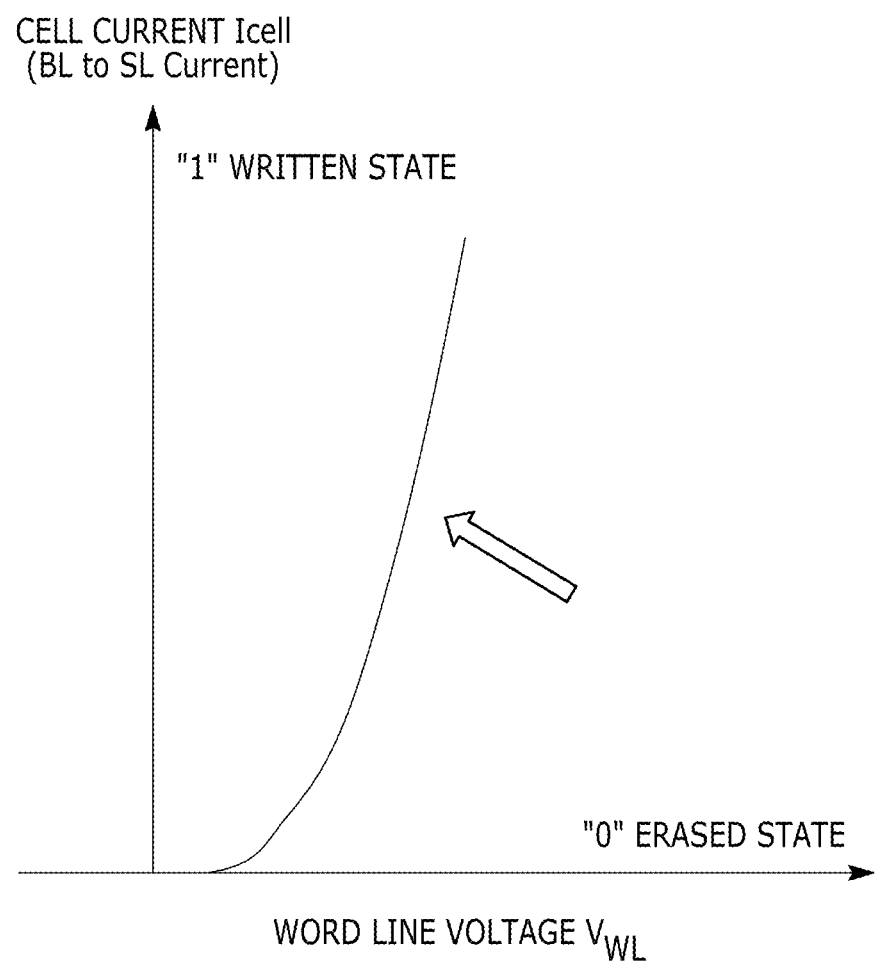

FIG. 3B illustrates holes 17 in the p layer 1aa when all biases are 0 V right after writing. The generated holes 17 as majority carriers in the p layer 1aa are temporarily accumulated in the p layer 1aa surrounded by a depleted layer 16 and charge, to positive bias, the p layer 1aa as the substrate of a MOSFET including the gate conductor layer 5 and the gate conductor layer 6a in effect in a non-equilibrium state. As a result, the threshold voltage of the MOSFET including the gate conductor layer 6a decreases by the positive substrate biasing effect with the holes temporarily accumulated in the p layer 1aa. Accordingly, the threshold voltage of the MOSFET including the gate conductor layer 6a connected to the word line WL becomes lower than that in the neutral state as illustrated in FIG. 3C. This written state is allocated as logically stored data "1".

The above-described conditions of voltage applied to the bit line BL, the source line SL, the word line WL, and the plate line PL are examples for performing write operation but may be any other conditions of operation voltage with which write operation can be performed. For example, when 3 V is applied to the bit line BL, 0 V is applied to the source line SL, 4 V is applied to the word line WL, and 1.5 V is applied to the plate line PL, the position of the pinch-off point 15 shifts toward the gate conductor layer 5 but the same phenomenon can be caused. When 3 V is applied to the bit line BL, 0 V is applied to the source line SL, 2 V is applied to the word line WL, and 2 V is applied to the plate line PL, the position of the pinch-off point 15 shifts toward the gate conductor layer 6a but still the same phenomenon can be caused.

Holes may be generated by causing flow of gate induced drain leakage (GIDL) current instead of causing the above-described impact ionization phenomenon (refer to Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020), for example).

At writing, surplus holes 17 can be accumulated nowhere when the p layer 1 is entirely occupied by a depleted layer extending from immediately below the first gate conductor layer 5 or immediately below the second gate conductor layer 6. Thus, it is needed to maintain a part at which the p layer 1 is not occupied by the depleted layer in any voltage applied state.

Figure 4A:
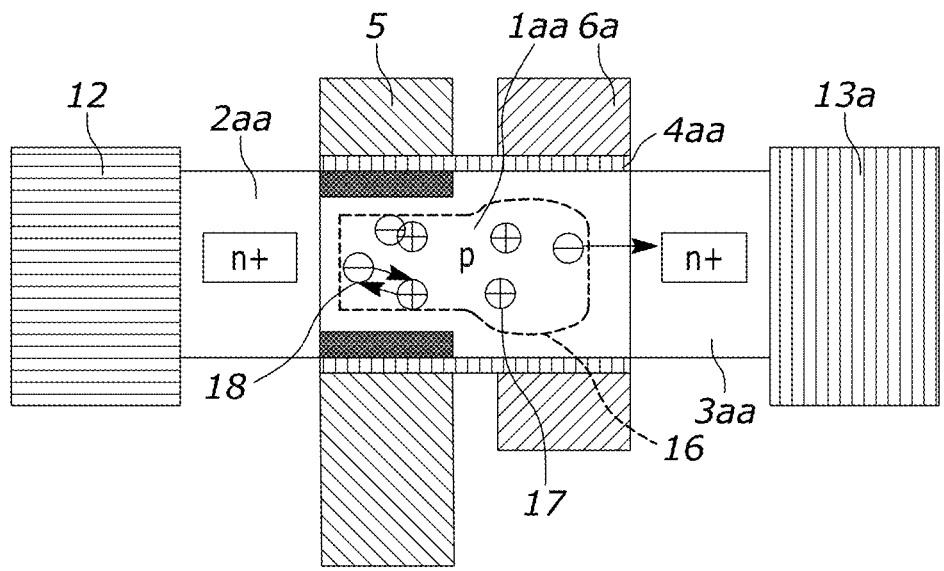
FIGS. 4A and 4B are diagrams for description of hole carrier accumulation right after the write operation, erase operation, and cell current in the memory device including semiconductor elements according to the first embodiment.
Figure 4B:
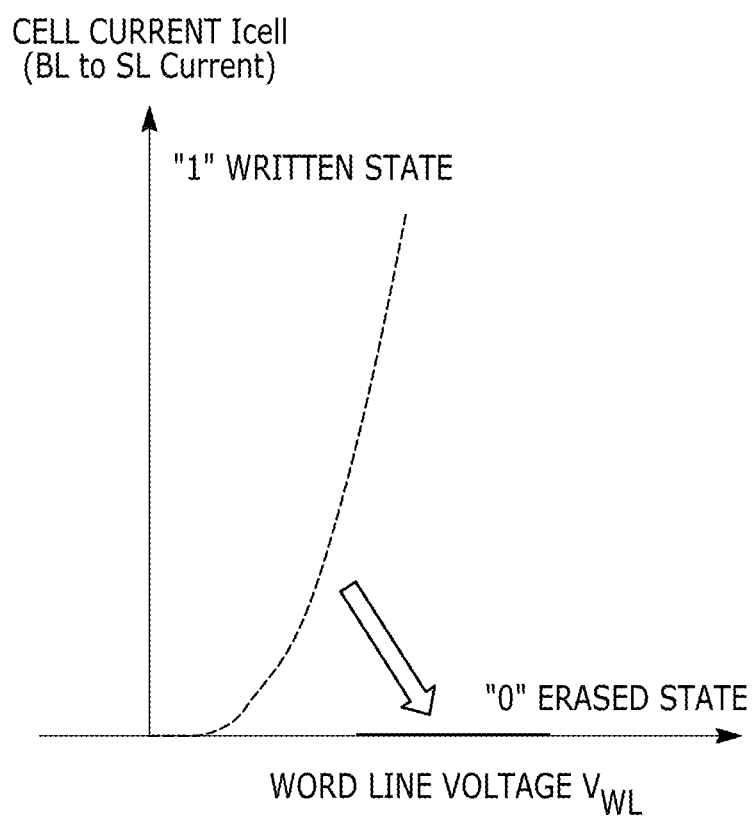

An erase operation mechanism of the dynamic flash memory according to the first embodiment illustrated in FIGS. 1A to 1D will be described below with reference to FIGS. 4A and 4B. In the state illustrated in FIG. 3B, 0.6 V is applied to the bit line BL, 0 V is applied to the source line SL, 2 V is applied to the plate line PL, and 0 V is applied to the word line WL. As a result, the concentration of holes 17 accumulated in the p layer 1aa is sufficiently higher than the concentration of holes in the n+ layer 2aa, and accordingly, holes flow into the n+ layer 2aa by diffusion due to the gradient of concentration. In contrast, the concentration of electrons in the n+ layer 2aa is higher than the concentration of electrons in the p layer 1aa, and accordingly, electrons 18 flow into the p layer 1aa by diffusion due to the gradient of concentration. The electrons having flowed into the p layer 1aa are annihilated through recombination with holes in the p layer 1aa. However, not all injected electrons 18 are annihilated, and electrons 18 not annihilated flow into the n+ layer 3aa through the depleted layer 16 by drifting due to the gradient of potential between the bit line BL and the source line SL. Since electrons are sequentially supplied from the source line SL, excessive holes recombine with electrons in an extremely short time and the initial state is reached again. Accordingly, the MOSFET including the gate conductor layer 6a connected to the word line WL returns to the original threshold value as illustrated in FIG. 4B. This erased state of the storage element is allocated as logically stored data "0".

Voltage applied to the bit line is adjustable to any range higher or lower than 0.6 V as long as electron drift in the depleted layer 16 occurs with the voltage. In other data erasing methods, the above-described conditions of voltage applied to the bit line BL, the source line SL, the word line WL, and the plate line PL may be any combination of: 0.6 V (BL), 0 V (SL), 0 V (PL), and 2 V (WL); 0 V (BL), 0.6 V (SL), 1 V (PL), and 0 V (WL); −0.6 V (BL), 0 V (SL), 1 V (PL), and 0 V (WL); or 1.5 V (BL), 0 V (SL), 0 V (PL), and 2.5 V (WL). The above-described conditions of voltage applied to the bit line BL, the source line SL, the word line WL, and the plate line PL are examples for performing erase operation and may be any other operation conditions with which erase operation can be performed.

FIGS. 5A to 5D illustrate an example of memory cell disposition for achieving a higher-dense memory device according to the first embodiment of the present invention. In FIGS. 5A to 5D, any part identical or similar to a part in FIGS. 1A to 1D is denoted by a reference sign with the same number as in FIGS. 1A to 1D.

Figure 5A:
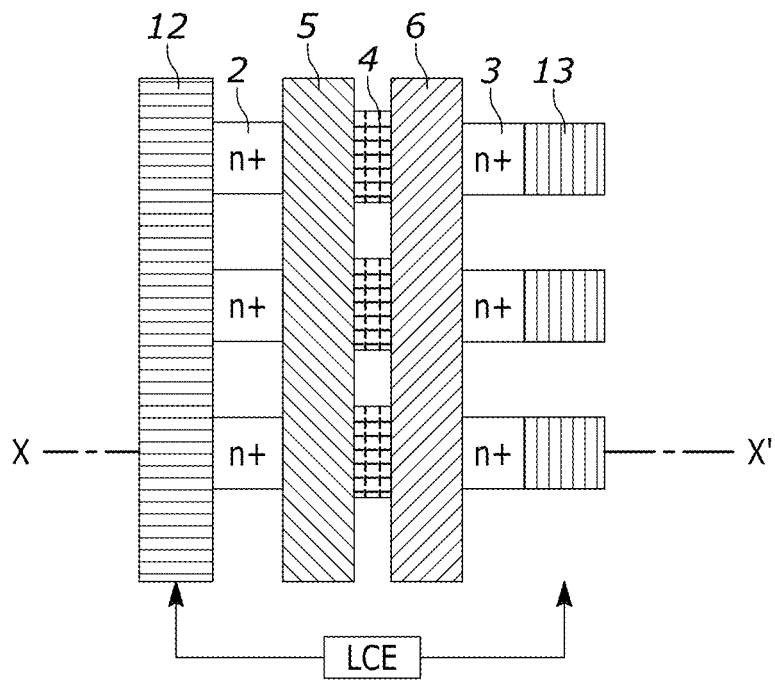
FIGS. 5A, 5B, 5C, and 5D are diagrams for description of cell disposition of the memory device including semiconductor elements according to the first embodiment.
Figure 5B:
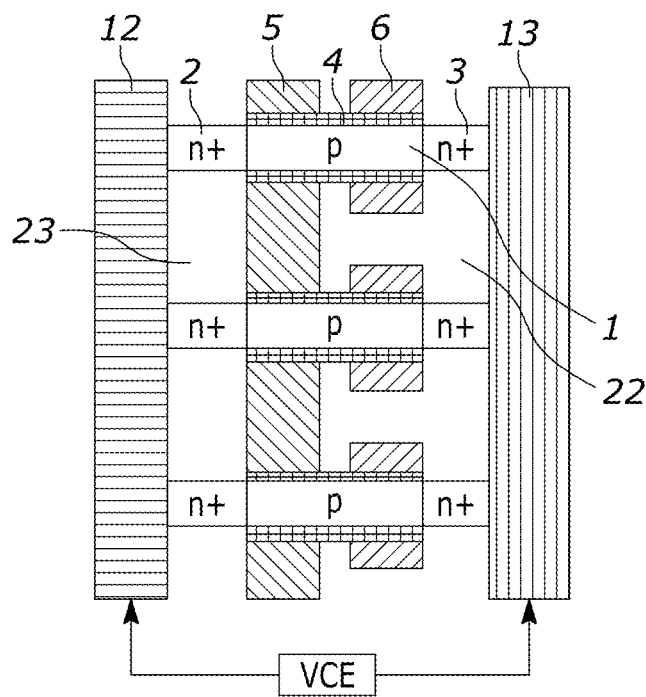

FIG. 5A is a plan view illustrating a plurality of cells except for the substrate 20 and the insulating layer 21 in FIG. 1A. In FIGS. 5A to 5D, the p layers 1aa to 1cc in FIGS. 1A to 1D are collectively referred to as p layers 1, the n+ layers 2aa to 2cc are collectively referred to as n+ layers 2, the n+ layers 3aa to 3cc are collectively referred to as n+ layers 3, the gate insulating layers 4aa to 4cc are collectively referred to as gate insulating layers 4, the gate conductor layers 6a to 6c are collectively referred to as gate conductor layers 6, and the wiring conductor layers 13a to 13c are referred to as wiring conductor layers 13. FIG. 5B illustrates a cross-sectional view along line X-X' in FIG. 5A.

Figure 5C:
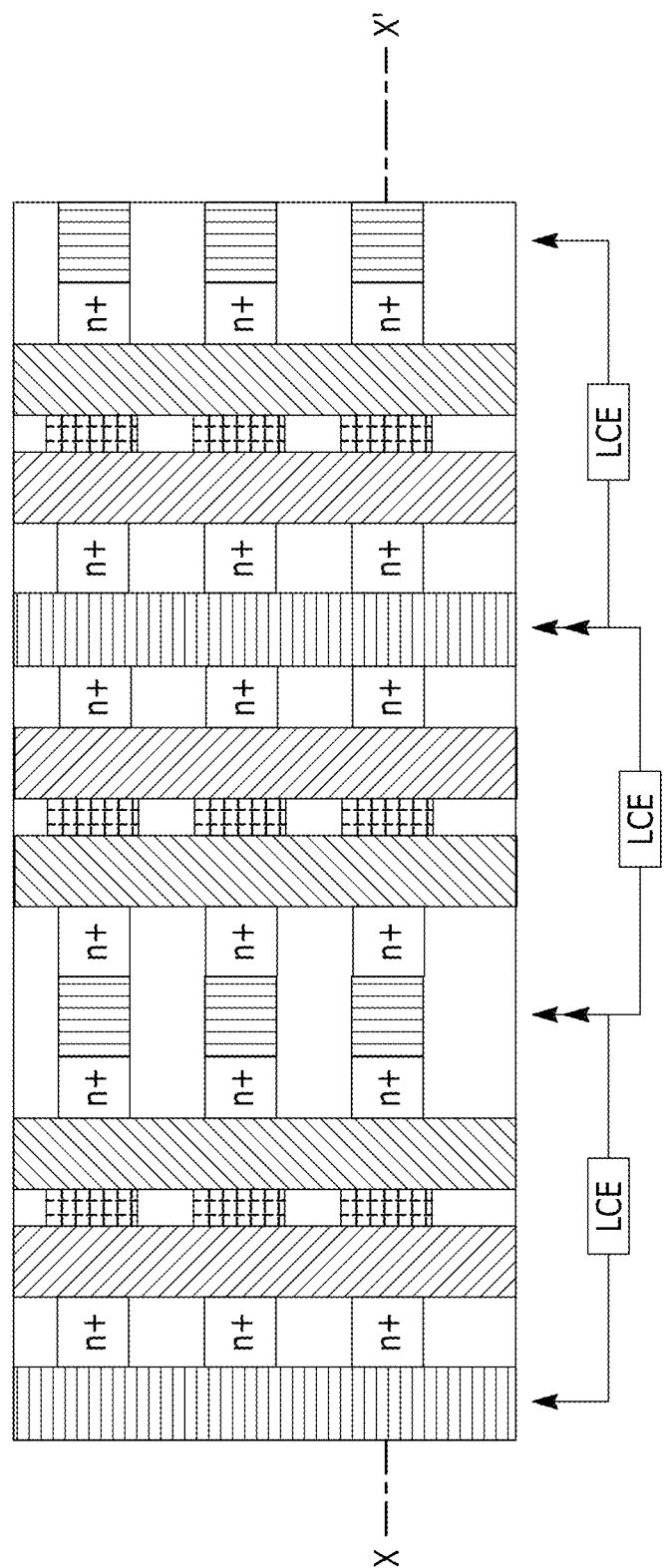

Constituent components included between a central part of the conductor layer 12 and a central part of each conductor layer 13 in FIG. 5A are defined as LCE. Constituent components included between the central part of the conductor layer 12 and the central part of each conductor layer 13 in FIG. 5B are defined as VCE. FIG. 5C illustrates an example in which units LCE in FIG. 5A are arranged in the positive direction, the right-left inverted direction, and the positive direction from the left on the insulating layer 21 contacting the substrate 20, the conductor layer 12 and the conductor layers 13 are shared by adjacent units, and accordingly, a total of 9×3=27 cells are disposed. Similarly, FIG. 5D illustrates a cross-sectional view of disposition in which units VCE in FIG. 5B are arranged in the positive direction, the right-left inverted direction, and the positive direction from the left and the conductor layer 12 and the conductor layers 13 are shared by adjacent units.

Figure 5D:
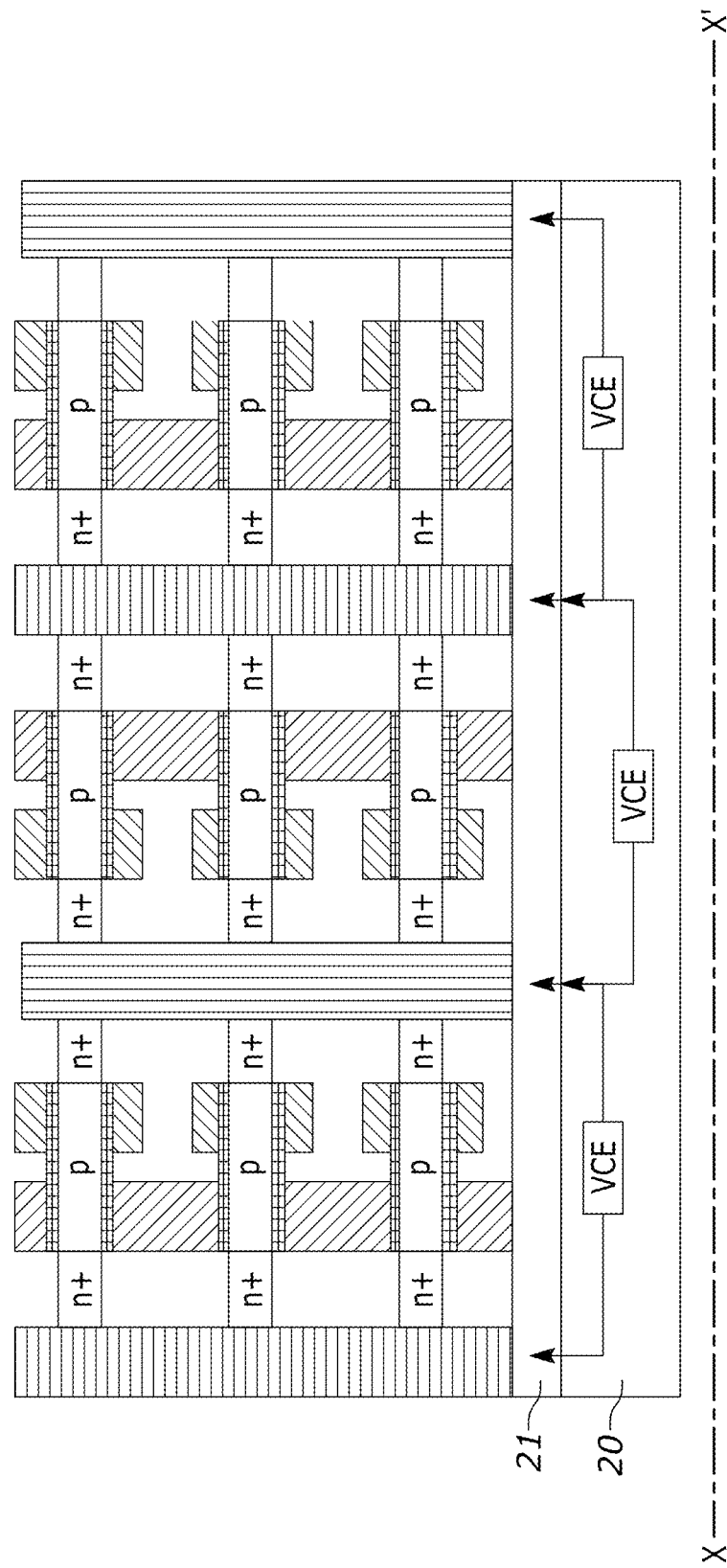

Although FIGS. 5A to 5D illustrate an example in which memory cells are arranged in the rightward direction, memory cells may be arranged in the upward direction in FIG. 5A or in the direction vertical to the substrate 20 in FIG. 5D.

Although the memory cells in FIGS. 5A to 5D are based on memory cells in FIGS. 1A to 1D, the n+ layers 2 of adjacent cells may be connected to each other and partially covered by the conductor layer 12 in exemplary arrangement of cells in FIGS. 2A to 2C. Similarly, the n+ layers 3 of adjacent cells may be connected to each other and partially covered by the conductor layers 13.

Figure 6B:
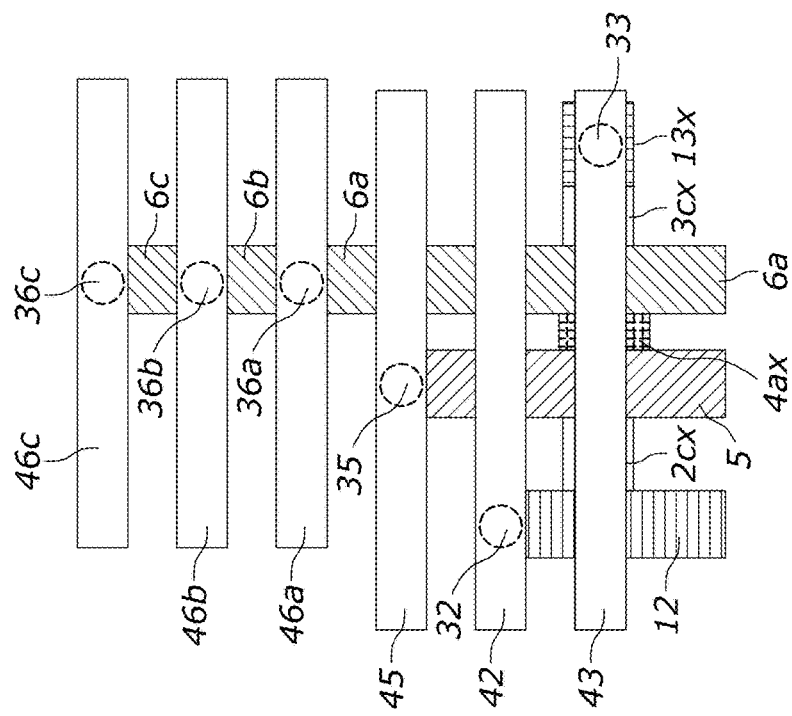
FIGS. 6A and 6B are diagrams for description of a last edge of a cell array in the memory device including semiconductor elements according to the first embodiment.
Figure 6A:
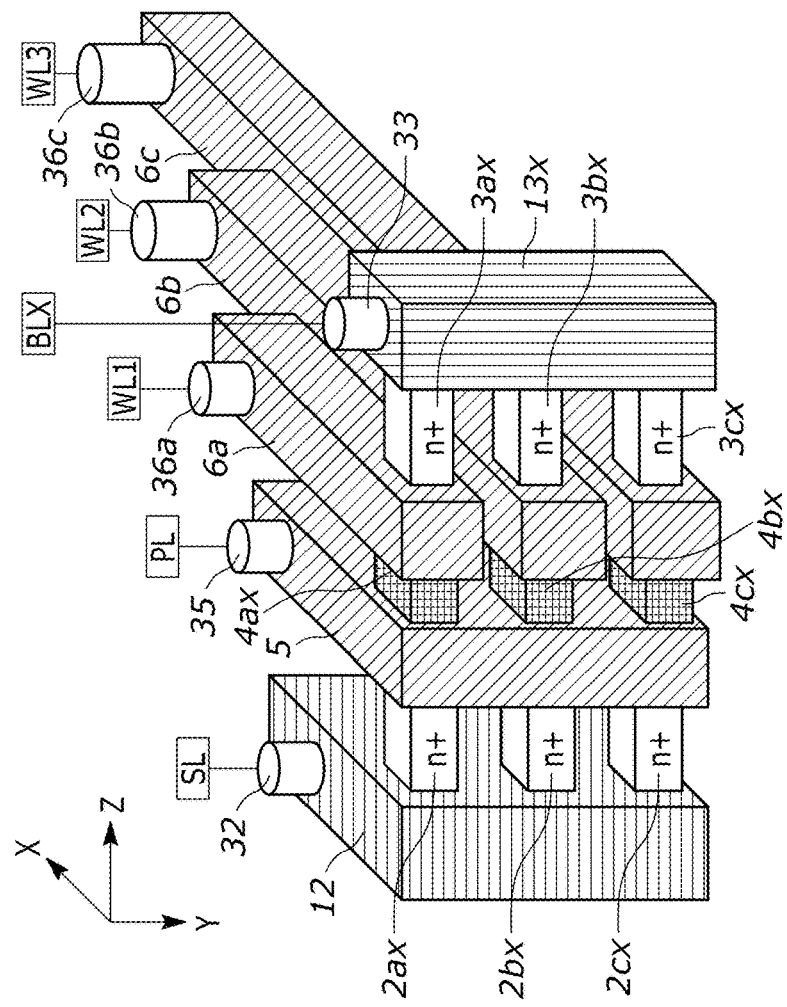

FIGS. 6A and 6B illustrate electrode disposition and a wiring structure at a last edge of a cell array of the dynamic flash memory according to the first embodiment of the present invention. FIG. 6A illustrates a bird's eye view of a memory cell on the x-th row and electrodes at terminal ends thereof when memory cells 8 are arrayed on three columns and x rows in the directions vertical and horizontal to the substrate (not illustrated). Constituent components of the cell are n+ layers 2ax to 2cx, n+ layers 3ax to 3cx, gate insulating layers 4ax to 4cx, the gate conductor layer 5, the gate conductor layers 6a to 6c, the conductor layer 12, and a conductor layer 13x. The conductor layer 12 is connected to the source line SL through an electrode 32 (example of "first metal electrode" in the claims). The gate conductor layer 5 is connected to the plate line PL through an electrode 35 (example of "second metal electrode" in the claims). The conductor layer 13x is connected to the corresponding bit line BL through an electrode 33 (example of "third metal electrode" in the claims). The gate conductor layer 6a is connected to the word line WL1 through an electrode 36a (example of "fourth metal electrode" in the claims). The gate conductor layer 6b is connected to the word line WL2 through an electrode 36b. The gate conductor layer 6c is connected to the word line WL3 through an electrode 36c.

The electrodes 32, 33, 35, 36a, 36b, and 36c may be formed of any material as long as they are electrically connected to the conductor layer 12, the conductor layer 13x, the gate conductor layer 5, and the gate conductor layers 6a, 6b, and 6c, respectively, and electrically joined to materials wired above.

FIG. 6B illustrates a plan view of an example in which metal wires are connected to the respective electrodes illustrated in FIG. 6A. The electrode 33 is electrically connected to a metal wiring layer 43 as the bit line. The electrode 32 is electrically connected to a metal wiring layer 42 as the source line. The electrode 35 is electrically connected to a metal wiring layer 45 as the plate line. The electrode 36a is electrically connected to a metal wiring layer 46a as the word line WL1. The electrode 36b is electrically connected to a metal wiring layer 46b as the word line WL2. The electrode 36c is electrically connected to a metal wiring layer 46c as the word line WL3.

Although not illustrated in FIGS. 6A and 6B, cell arrays are arranged on the lower side (x direction) in FIG. 6B. It can be also understood that the electrodes 33, 32, 35, 36a, 36b, and 36c are disposed in the stated order in a plan view as illustrated in FIG. 6B and bit lines can be arranged at a minimum wiring pitch in any cell array not at the last edge.

Although FIGS. 6A and 6B illustrate no arrangement in the z direction, it is possible to perform arrangement without relaxation of any metal wiring pitch and to change layers for each block and provide wires to the respective layers, and thus memory density is not degraded.

The electrodes 36a, 36b, and 36c have different heights and the electrodes 32, 33, 35, 36a, 36b, and 36c have upper surfaces aligned at the same height as illustrated in FIG. 6A and are each wired with a metal wiring layer in the same layer as illustrated in FIG. 6B. However, electrodes for connection of the plate line, the bit line, and the source line may be provided at a plurality of levels and have mutually different heights, and metal wires in different layers may be used. Alternatively, connection may be made with metal wiring layers in mutually different layers by using a multilayer wiring technology.

Moreover, each electrode is illustrated as a cylinder but may have a section of a polygonal shape such as a rectangular shape.

The present embodiment has the following characteristics.

Characteristic 1

In the dynamic flash memory according to the first embodiment of the present invention, a plurality of memory cells are stacked in the direction vertical to the substrate, and adjacent cells are electrically shielded from each other by the gate conductor layers 6. In conventional memory cell disposition, when memory cells are highly densely disposed with a minimum line width, electric mutual interaction between the memory cells increases. However, memory density decreases when the word-line interval between cells is increased to prevent the mutual interaction. According to the first embodiment of the present invention, it is possible to achieve memory cell disposition with less mutual interaction without changing area in a plan view, thereby achieving highly-dense and wide-margin memory cell disposition.

Characteristic 2

In the dynamic flash memory according to the first embodiment of the present invention, it is possible to freely adjust the thickness of the semiconductor layer 1 of each memory cell in the vertical direction without sacrificing memory density in a plan view, and thus it is possible to increase the number of carriers at writing, thereby achieving a wider margin of memory operation.

Characteristic 3

In the dynamic flash memory according to the first embodiment of the present invention, it is possible to increase the interval between memory cells in the direction vertical to the substrate without sacrificing memory density. Thus, it is possible to increase the interval between the word lines 6 of the memories in the vertical direction, thereby reducing parasitic capacitance as compared to conventional cases. Moreover, it is possible to increase the thickness of each word line 6 in the vertical direction in effect, thereby reducing parasitic resistance. This contributes to high-speed memory operation.

Characteristic 4

In the dynamic flash memory according to the first embodiment of the present invention, it is possible to connect a plurality of memory cells to conductor layers 13 connected to the bit lines BL in the vertical direction. Thus, it is possible to achieve short wiring as compared to conventional cases in which memory cells are two-dimensionally disposed. Accordingly, parasitic resistance and parasitic capacitance are reduced as compared to conventional cases, which leads to higher-speed memory operation with a wider operation margin. In conventional memory cell disposition, it is important to connect a larger number of memory cells to the same bit line in order to reduce area in a plan view. However, when a large number of cells are connected to the same bit line, two-dimensional arrangement dependency of parasitic resistance and parasitic capacitance becomes larger and the memory operation margin becomes narrower, which has been a problem.

Characteristic 5

In the dynamic flash memory according to the first embodiment of the present invention, it is possible to connect a plurality of memory cells to the conductor layer 12 connected to the source line SL in the vertical direction. Accordingly, similarly to the case of the bit lines, parasitic resistance and parasitic capacitance are reduced as compared to conventional cases, and the reference potential of each memory cell can be stably fixed. Accordingly, it is possible to reduce memory area without changing area in a plan view, thereby increasing the memory operation margin.

Characteristic 6

In the dynamic flash memory according to the first embodiment of the present invention, it is possible to achieve arrangement in which any conductor layer 13 connected to a bit line and the conductor layer 12 connected to a source line are shared by a plurality of memory cells as illustrated in FIGS. 5A to 5D, and thus it is possible to achieve a highly-dense memory.

Characteristic 7

In the dynamic flash memory according to the first embodiment of the present invention, it is possible to arrange metal wiring layers of the word lines and the bit lines connected to memory cells with minimum dimensions as illustrated in FIGS. 6A and 6B, thereby achieving a highly-dense memory device. In conventional cases, the bit lines and the word lines need to vertically arranged, and it has been impossible to form a word line and a bit line in the same metal wiring layer.

The present invention can have various embodiments and modifications without departing from the spirit and scope of the present invention. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

With a semiconductor element according to the present invention, it is possible to provide a higher-dense and higher-speed semiconductor memory device with a high operation margin as compared to conventional cases.

REFERENCE SIGNS LIST 2, 2aa, 2ab, 2ac, 2ba, 2bb, 2bc, 2ca, 2cb, 2cc, 2ax, 2bx, 2cx n+ layer 3, 3aa, 3ab, 3ac, 3ba, 3bb, 3bc, 3ca, 3cb, 3cc, 3ax, 3bx, 3cx n+ layer 4, 4aa, 4ab, 4ac, 4ba, 4bb, 4bc, 4ca, 4cb, 4cc, 4ax, 4bx, 4cx gate insulating layer
5 first gate conductor layer
6, 6a, 6b, 6c second gate conductor layer
12 first wiring conductor layer
13, 13a, 13b, 13c second wiring conductor layer
14 inversion layer
15 pinch-off point
16 depleted layer
17 surplus hole
18 injected electrons
20 substrate
21 first insulating layer
22 second insulating layer
23 third insulating layer
32 first electrode
33 first electrode
34 first electrode
35 first electrode
36a, 36b, 36c first electrode
42 metal wiring layer (connected to source line SL)
43 metal wiring layer (connected to bit line BL)
45 metal wiring layer (connected to plate line PL)
46a, 46b, 46c metal wiring layer (connected to word lines WL1, wL2, and WL3)

What is claimed is:

1. A semiconductor memory device comprising:
a first insulating layer disposed on a substrate, wherein a direction in parallel to an upper surface of the substrate is defined an X direction, a direction in perpendicular to the upper surface of the substrate is defined a Z direction, and a direction in perpendicular to both the X and Z directions is defined a Y direction;
a plurality of first impurity layers placed separately from the first insulating layer and each extending in the X direction, wherein the plurality of first impurity layers are placed one over another in the Z direction and each have first and second ends;
a plurality of semiconductor layers each having first and second ends, wherein the plurality of semiconductor layers each extend in the X direction from the second end of a corresponding first impurity layer with the first end of the semiconductor layer being in contact with the second end of the corresponding first impurity layer;
a plurality of second impurity layers each having first and second ends, wherein the plurality of second impurity layers each extend in the X direction from the second end end of a corresponding semiconductor layer with the first end of the second impurity layer being in contact with the second end of the corresponding semiconductor layer;
a plurality of gate insulating layers covering the plurality of semiconductor layers, respectively, wherein the plurality of gate insulating layers partially cover the plurality of first impurity layers and the plurality of second impurity layer, respectively;
a first gate conductor layer disposed in contact with the plurality of gate insulating layers in proximity to the plurality of first impurity layers;
a plurality of second gate conductor layers disposed, separately from the first gate conductor layer, in contact with the plurality of gate insulating layers in proximity to the plurality of second impurity layers;
a first conductor layer connected to the first ends of the plurality of first impurity layers;
a second conductor layer connected to the second ends of the plurality of second impurity layers;
a second insulating layer contacting the first insulating layer, the first gate conductor layer, and the first conductor layer; and
a third insulating layer contacting the first insulating layer, the plurality of second gate conductor layers, and the second conductor layer, wherein
memory write operation is performed by controlling voltage applied to each of the first conductor layer, the second conductor layer, the first gate conductor layer, and the plurality of second gate conductor layers to perform operation of generating electrons and holes in the plurality of semiconductor layers through an impact ionization phenomenon with current flowing between the plurality of first impurity layers and the plurality of second impurity layers or through gate induced drain leakage current and perform operation of retaining, in the plurality of semiconductor layers, some or all of the generated electrons or holes that are majority carriers in the plurality of semiconductor layers,
memory erase operation is performed by controlling voltage applied to each of the first conductor layer, the second conductor layer, the first gate conductor layer, and the plurality of second gate conductor layers to remove the retained electrons or holes that are majority carriers in the semiconductor layers from at least either of the plurality of first impurity layers and the plurality of second impurity layers, and
the first conductor layer connected to the plurality of first impurity layers is connected to a source line, the second conductor layer connected to the plurality of second impurity layers is connected to a bit line, the first gate conductor layer is connected to a plate line, the plurality of second gate conductor layers are each connected to a word line, and predetermined voltage is provided to each of the source line, the bit line, the plate line, and the word line to perform memory writing and erasure.

2. A memory cell including the semiconductor memory device according to claim 1, wherein the memory cell includes a semiconductor device formed with the first impurity layer, the second impurity layer, one of the semiconductor layers, one of the gate insulating layers, the first gate conductor layer, and one of the second gate conductor layers, and wherein a cross-sectional area of the semiconductor layer is larger than a total area of maximum depleted layer widths each extending from the first gate conductor layer or the second gate conductor layer located immediately below.

3. The memory cell according to claim 2, wherein an interval between the memory cells adjacent to each other in the Z direction is larger than an interval between the memory cells adjacent to each other in the X direction.

4. The memory cell according to claim 3, wherein area of a surface at which the second conductor layer contacts each of the plurality of second impurity layers is equal to or larger than cross-sectional area of a corresponding one of the plurality of semiconductor layers connected to the plurality of second impurity layers.

5. The memory cell according to claim 2, wherein the plurality of second gate conductor layers are each shared by the memory cells adjacent to each other in the X direction.

6. The memory cell according to claim 2, wherein the first gate conductor layer is shared by a plurality of memory cells adjacent to each other in the X or Z direction.

7. The memory cell according to claim 2, wherein area of a surface at which the first conductor layer contacts each of the plurality of first impurity layers is equal to or larger than a cross-sectional area of a corresponding one of the plurality of semiconductor layers connected to the first impurity layers.

8. The memory cell according to claim 2, wherein at least one of each of the plurality of first impurity layers or each of the plurality of second impurity layers is shared by memory cells adjacent to each other in the X direction.

9. The memory cell according to claim 2, wherein at a terminal end of a memory cell array, a first metal electrode contacts the first conductor layer and is connected to the source line, a second metal electrode contacts the first gate conductor layer and is connected to the plate line, a third metal electrode contacts the second conductor layer and is connected to the bit line, and a plurality of fourth metal electrodes contact the plurality of respective second gate conductor layers and are connected to respective word lines.

10. The memory cell according to claim 2, wherein at least some metal wires that function as a plate line, a source line, a word line, and a bit line among metal wires connecting memory cell arrays are formed as metal wires of a same layer.

\* \* \* \* \*

UNITED STATES PATENT AND TRADEMARK OFFICE
CERTIFICATE OF CORRECTION

| | |
|---|---|
| PATENT NO. | : 12,283,310 B2 |
| APPLICATION NO. | : 18/180117 |
| DATED | : April 22, 2025 |
| INVENTOR(S) | : Masakazu Kakumu et al. |

Page 1 of 1

It is certified that error appears in the above-identified patent and that said Letters Patent is hereby corrected as shown below:

In the Claims
Column 13, Claim 1, Line 50, delete "end end"
And replace with --end--

Signed and Sealed this
First Day of July, 2025

Coke Morgan Stewart
*Acting Director of the United States Patent and Trademark Office*